US012782391B2

(12) United States Patent
Mori

(10) Patent No.: US 12,782,391 B2
(45) Date of Patent: Nov. 3, 2026

(54) CONDUCTION INSPECTION JIG AND METHOD FOR MANUFACTURING PRINTED WIRING BOARD

(71) Applicant: IBIDEN CO., LTD., Ogaki (JP)

(72) Inventor: Takayuki Mori, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 107 days.

(21) Appl. No.: 18/453,354

(22) Filed: Aug. 22, 2023

(65) Prior Publication Data

US 2024/0069068 A1 Feb. 29, 2024

(30) Foreign Application Priority Data

Aug. 24, 2022 (JP) ................................ 2022-133690

(51) Int. Cl.
*G01R 1/073* (2006.01)

(52) U.S. Cl.
CPC ................................ *G01R 1/07328* (2013.01)

(58) Field of Classification Search
CPC ............ G01R 1/07328; G01R 1/07321; G01R 1/07354
See application file for complete search history.

(56) References Cited

U.S. PATENT DOCUMENTS 4,963,822 A * 10/1990 Prokopp ............ G01R 1/07328 324/763.01
5,399,982 A * 3/1995 Driller ............... G01R 1/07378 324/754.13
5,945,836 A * 8/1999 Sayre ................. G01R 1/07378 324/755.05
6,297,657 B1 * 10/2001 Thiessen ............ G01R 1/07357 324/754.13
6,407,565 B1 * 6/2002 Sayre ................. G01R 1/07328 324/763.01
2002/0011858 A1 * 1/2002 Theissen ............ G01R 1/07314 324/755.11
2004/0157475 A1 * 8/2004 Kazama ............. G01R 1/07314 439/54
2010/0102841 A1 * 4/2010 Kawada ............. G01R 1/06733 324/754.01

(Continued)

FOREIGN PATENT DOCUMENTS

JP 2011-122909 A 6/2011
WO WO-2021023739 A1 * 2/2021 ......... G01R 1/06738

*Primary Examiner* — Paresh Patel
(74) *Attorney, Agent, or Firm* — Finnegan, Henderson, Farabow, Garrett & Dunner, LLP

(57) ABSTRACT

A conduction inspection jig includes a first member having first openings and a flexural strength of 300 MPa or higher, a second member having second openings and positioned above the first member, a support member positioned between the first member and the second member such that the support member is forming a space between the first member and the second member, and a probe that is positioned in one of the first openings in the first member and one of the second openings in the second member such that the probe penetrates through the one of the first openings, the space formed between the first member and the second member, and the one of the second openings and has a first end portion protruding from the first member and a second end portion protruding from the second member on the opposite side with respect to the first end portion.

20 Claims, 3 Drawing Sheets

(56) References Cited

U.S. PATENT DOCUMENTS

| | | | | |
|---|---|---|---|---|
| 2015/0054537 | A1* | 2/2015 | Taber, Jr. ........... | G01R 1/07314 324/750.25 |
| 2017/0122984 | A1* | 5/2017 | Hsu .................... | G01R 1/07314 |
| 2020/0271693 | A1* | 8/2020 | Ahn ................... | G01R 1/07371 |
| 2021/0199696 | A1* | 7/2021 | Ahn ......................... | G01R 3/00 |
| 2022/0034938 | A1* | 2/2022 | Tsumura ............ | G01R 1/07314 |

* cited by examiner

CONDUCTION INSPECTION JIG AND METHOD FOR MANUFACTURING PRINTED WIRING BOARD

CROSS-REFERENCE TO RELATED APPLICATIONS

The present application is based upon and claims the benefit of priority to Japanese Patent Application No. 2022-133690, filed Aug. 24, 2022, the entire contents of which are incorporated herein by reference.

BACKGROUND OF THE INVENTION

Field of the Invention

A technology described herein relates to a conduction inspection jig and a method for manufacturing a printed wiring board.

Description of Background Art

Japanese Patent Application Laid-Open Publication No. 2011-122909 describes a conduction inspection jig having an inspection probe, a connecting body having multiple electrode parts, and a holding body for holding the inspection probe. The entire contents of this publication are incorporated herein by reference.

SUMMARY OF THE INVENTION

According to one aspect of the present invention, a conduction inspection jig includes a first member having first openings and a flexural strength of 300 MPa or higher, a second member having second openings and positioned above the first member, a support member positioned between the first member and the second member such that the support member is forming a space between the first member and the second member, and a probe that is positioned in one of the first openings in the first member and one of the second openings in the second member such that the probe penetrates through the one of the first openings, the space formed between the first member and the second member, and the one of the second openings and has a first end portion protruding from the first member and a second end portion protruding from the second member on the opposite side with respect to the first end portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
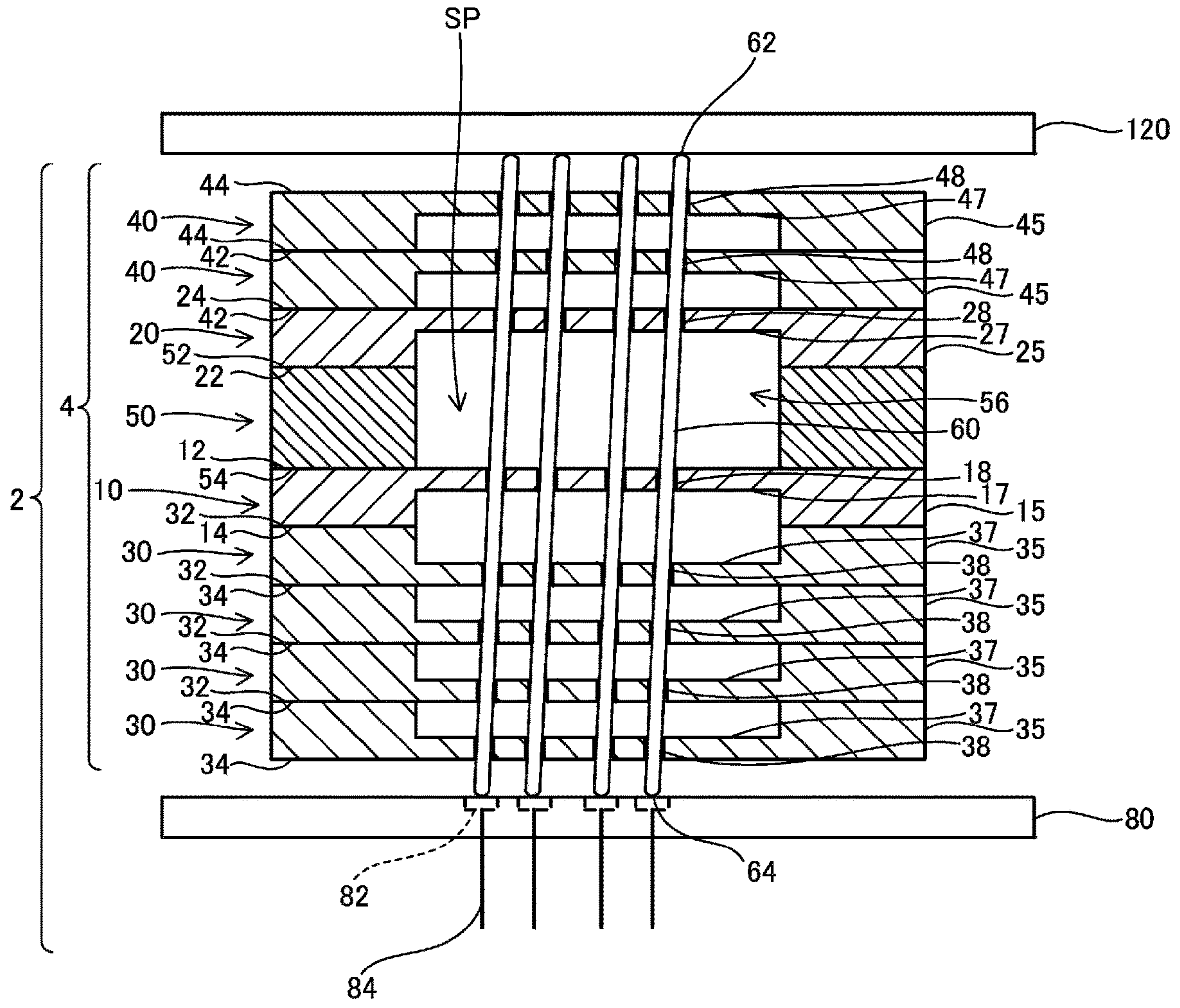
FIG. 1 is a cross-sectional view schematically illustrating an inspection device according to an embodiment of the present invention.

Embodiments will now be described with reference to the accompanying drawings, wherein like reference numerals designate corresponding or identical elements throughout the various drawings.

EMBODIMENT

FIG. 1 is a cross-sectional view illustrating an inspection device 2 of an embodiment and a printed wiring board 120 to be inspected. The inspection device 2 performs electrical inspection of the printed wiring board 120, which has wirings. The inspection device 2 has a conduction inspection jig 4. The conduction inspection jig 4 is formed by a first member 10, a second member 20, one or more third members 30, one or more fourth members 40, a support member 50, and multiple probes 60. Preferably, there are two or more third members 30. Preferably, there are two or more fourth members 40. A space (SP) is formed between the first member 10 and the second member 20. The third members 30 are provided below the first member 10. the fourth members 40 are provided above the second member 20. The first member 10 and the third members 30 are positioned on a substrate 80 side (device side). The second member 20 and the fourth members 40 are positioned on the printed wiring board 120 side (inspection target side). The probes 60 penetrate the fourth members 40, the second member 20, the space (SP), the first member 10, and the third members 30. The inspection device 2 further has a substrate 80, which has terminals 82 below the first member 10, and lead wires 84, which respectively extend from the terminals 82. The lead wires 84 are electrically connected to a tester (not illustrated in the drawings).

Figure 2A:
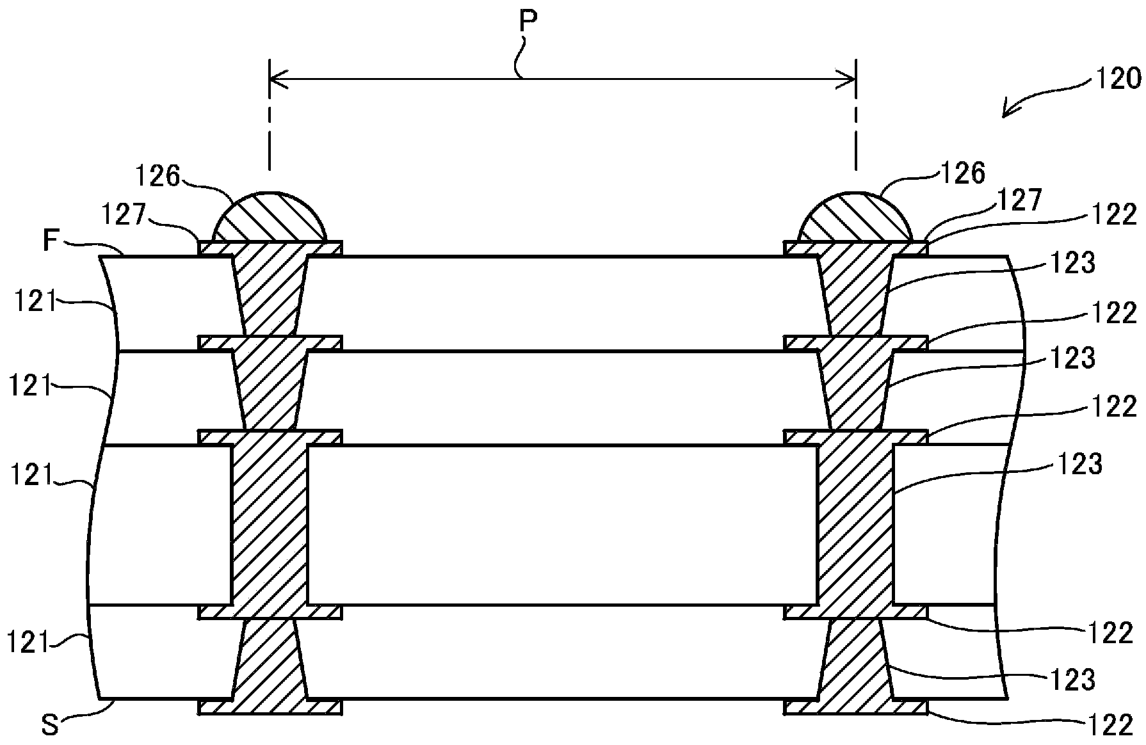
FIG. 2A is a cross-sectional view schematically illustrating a printed wiring board to be inspected.
Figure 2B:
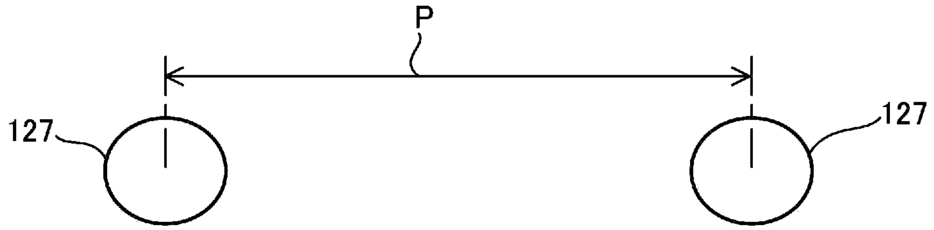
FIG. 2B is a plan view schematically illustrating electrodes of the printed wiring board.

FIG. 2A illustrates an example of the printed wiring board 120 to be inspected. FIG. 2A illustrates a cross section of the printed wiring board 120. The printed wiring board 120 includes multiple resin insulating layers 121 and multiple conductor layers 122. The resin insulating layers 121 and the conductor layers 122 are alternately laminated. Adjacent conductor layers 122 are connected by via conductors 123. The printed wiring board 120 has a front surface (F) and a back surface (S) on the opposite side with respect to the front surface (F). There are multiple electrodes 127 on the front surface (F). FIG. 2B is a plan view of the electrodes 127. Two adjacent electrodes 127 are depicted in FIG. 2B. A pitch (P) between adjacent electrodes 127 is illustrated in FIGS. 2A and 2B. The pitch (P) is a distance between centers of adjacent electrodes 127.

As illustrated in FIG. 1, the first member 10 has a first surface 12 (upper surface in the drawing) on the second member 20 side and a second surface 14 (lower surface in the drawing) on the opposite side with respect to the first surface 12. The first surface 12 faces the space (SP). The second surface 14 faces the third members 30. The first member 10 has a peripheral part 15 and a central part 17. The central part 17 is thinner than the peripheral part 15. Multiple first openings 18 are formed in the central part 17. The probes 60 respectively penetrate the first openings 18. For example, the first member is formed of ceramic. The first member 10 has a flexural strength of 300 MPa or higher. The first member 10 may be a member formed of resin having a flexural strength of 300 MPa or higher.

The multiple third members 30 are laminated below the first member 10. The number of the third members 30 is four. In a modified example, the number of the third members 30 is 1 or more. The third members 30 each have a first surface 32 (upper surface in the drawing) on the first member 10 side and a second surface 34 (lower surface in the drawing) on the opposite side with respect to the first surface 32. The first surface 32 of the uppermost third member 30 faces the first member 10. The second surface 34 of the lowermost third member 30 faces the substrate 80. The third members 30 each have a peripheral part 35 and a central part 37. The central part 37 is thinner than the peripheral part 35. The central part 37 has multiple third openings 38. The probes 60 respectively penetrate the third openings 38. For example, the third members 30 are formed of resin. The third members 30 have a flexural strength of lower than 300 MPa.

The second member 20 has a first surface 22 (lower surface in the drawing) on the first member 10 side and a second surface 24 (upper surface in the drawing) on the opposite side with respect to the first surface 22. The first surface 22 faces the space (SP). The second surface 24 faces the fourth members 40. The second member 20 has a peripheral part 25 and a central part 27. The central part 27 is thinner than the peripheral part 25. The central part 27 has multiple second openings 28. The probes 60 respectively penetrate the second openings 28. For example, the second member 20 is formed of ceramic. The second member 20 has a flexural strength of 300 MPa or higher. The second member 20 may be a member formed of resin having a flexural strength of 300 MPa or higher.

The multiple fourth members 40 are laminated below the second member 20. The number of the fourth members 40 is two. In a modified example, the number of the fourth members 40 is 1 or more. The fourth members each have a first surface 42 (lower surface in the drawing) on the second member 20 side and a second surface 44 (upper surface in the drawing) on the opposite side with respect to the first surface 42. The first surface 42 of the lowermost fourth member 40 faces the second surface 24 of the second member 20. The second surface 44 of the uppermost fourth member 40 faces the printed wiring board 120. The fourth members 40 each have a peripheral part 45 and a central part 47. The central part 47 is thinner than the peripheral part 45. The central part 47 has multiple fourth openings 48. The probes 60 respectively penetrate the fourth openings 48. The fourth members 40 are formed of resin. The fourth members 40 have a flexural strength of lower than 300 MPa.

Figure 3:
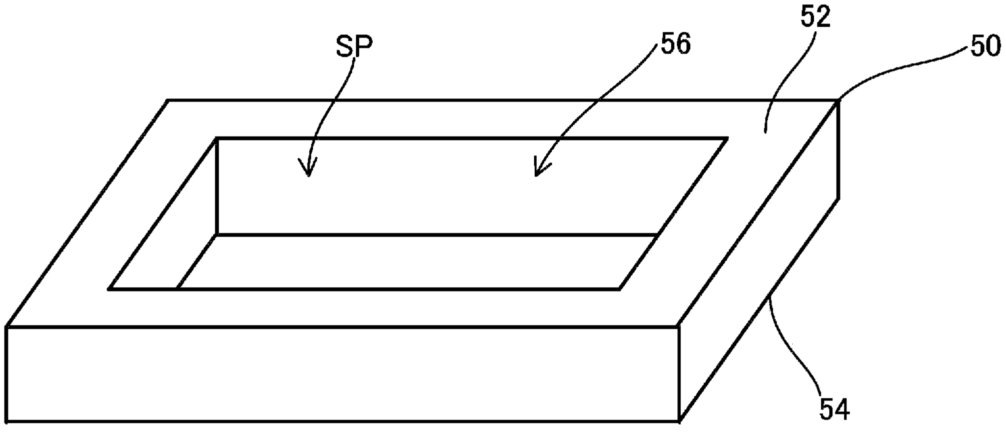
FIG. 3 is a perspective view illustrating an example of a support member.

The support member 50 is positioned between the first member 10 and the second member. As illustrated in FIGS. 1 and 3, the support member 50 substantially surrounds the space (SP). As illustrated in FIG. 3, the support member 50 has an upper surface 52 facing the second member 20, a lower surface 54 facing the first member 10, and an opening part 56 forming the space (SP). The support member 50 is formed of a single member. In a modified example, the support member 50 may be formed of a combination of multiple members.

As illustrated in FIG. 1, the probes 60 each have an end 62 and another end 64 on the opposite side with respect to the end 62. The end 62 protrudes from the fourth member 40. The other end 64 protrudes from the third member 30. The probes 60 are each formed of a conductive wire and an insulating film covering a side surface of the conductive wire. The probes 60 are flexible. The probes 60 each penetrate one third opening 38, one first opening 18, the space (SP), one second opening 28, and one fourth opening 48. During inspection, the ends 62 of the probes 60 are electrically connected to the electrodes 127 of the printed wiring board 120. As illustrated in FIG. 2A, when the printed wiring board 120 has bumps 126 on the electrodes 127, the ends 62 make contact with the bumps 126. During inspection, the other ends 64 of the probes 60 are connected to the terminals 82.

The second openings 28 are not respectively formed directly above the first openings 18. The third openings 38 are not respectively formed directly below the first openings 18. The fourth openings 48 are not respectively formed directly above the second openings 28. The first openings 18, the second openings 28, the third openings 38 and the fourth openings 48 are formed such that the probes 60 are obliquely positioned. The probes 60 are similarly inclined. During inspection, the ends 62 make contact with the electrodes 127 or the bumps 126 of the printed wiring board 120, and the other ends 64 make contact with the terminals 82. In this case, since the probes 60 are similarly inclined, the probes 60 bend in the same direction. All the probes 60 bend in the same direction in the space (SP).

During inspection, when the probes 60 bend, the probes 60 press against wall surfaces (first wall surfaces) of the first member 10 exposed by the first openings 18 of the first member 10. Or, the probes 60 press against corners between the first wall surfaces and the first surface 12. Or, the probes 60 press against corners between the first wall surfaces and the second surface 14. Substantially, all the probes 60 similarly apply a stress to the first member 10. Therefore, the first member 10 is likely to be subjected to a large stress. However, in the embodiment, the first member 10 has a flexural strength of 300 MPa or higher. During inspection, even when the probes 60 press against the first member 10, the first member 10 is unlikely to break. The conduction inspection jig 4 of the embodiment provides accurate inspection results over an extended period.

During inspection, similar to the first member 10, the second member 20 is pressed by the probes 60. The second member 20 has a flexural strength of 300 MPa or higher. The second member 20 is unlikely to break.

Modified Example 1 of Embodiment

A conduction inspection jig 4 of Modified Example 1 does not have the support member 50 that substantially surround the space (SP). Instead, supporting posts are positioned between the first member 10 and the second member 20. By positioning the supporting posts between the first member 10 and the second member 20, a space (SP) is formed between the first member 10 and the second member 20. The supporting posts are an example of a support member.

Modified Example 2 of Embodiment

In the conduction inspection jig 4 of Modified Example 2, the third members 30 are omitted. Only the first member 10 is positioned below the space (SP).

Alternative Example 1 of Modified Example 2

In the conduction inspection jig 4 of Alternative Example 1 of Modified Example 2, the fourth members 40 are omitted. Only the second member 20 is positioned above the space (SP).

Alternative Example 2 of Modified Example 2

In the conduction inspection jig 4 of Alternative Example 2 of Modified Example 2, the third members 30 and the fourth members 40 are omitted. Only the first member 10 is positioned below the space (SP), and only the second member 20 is positioned above the space (SP).

Modified Example 3 of Embodiment

In the conduction inspection jig 4 of Modified Example 3, the second member 20 has a flexural strength of lower than 300 MPa. The second member 20 is formed of resin.

Japanese Patent Application Laid-Open Publication No. 2011-122909 describes a conduction inspection jig having an inspection probe, a connecting body having multiple electrode parts, and a holding body for holding the inspection probe. The inspection probe has a front end part and a rear end part. The front end part makes contact with an inspection point and the rear end part makes contact with an electrode part. The holding body has a base part. The base part has a through hole for guiding the rear end part of the inspection probe to the electrode part.

In the conduction inspection jig of Japanese Patent Application Laid-Open Publication No. 2011-122909, when the front end part of the inspection probe makes contact with an inspection target, the inspection probe bends. It is thought that, when the inspection probe bends, the inspection probe comes into contact with an area around the through hole of the base part. It is thought that, when the inspection probe comes into contact with the area around the through hole of the base part, a large load is applied to the area around the through hole of the base part. It is thought that the base part is likely to break.

A conduction inspection jig according to an embodiment of the present invention includes: a first member that has multiple first openings; a second member that has multiple second openings and is positioned above the first member; a support member that is positioned between the first member and the second member to form a space between the first member and the second member; and a probe that penetrates one of the first openings, the space, and one of the second openings. The space is sandwiched between the first member and the second member, and the first member has a flexural strength of 300 MPa or more.

In a conduction inspection jig according to an embodiment of the present invention, it is thought that when the probe bends during inspection, the probe is likely to come into contact with an area around the one of the first openings of the first member. However, in a conduction inspection jig according to an embodiment of the present invention, the first member has a flexural strength of 300 MPa or higher. Even when the curved probe comes into contact with the area of the one of the first openings of the first member during inspection, the first member is unlikely to break. According to an embodiment of the present invention, accurate inspection results can be provided over an extended period.

Obviously, numerous modifications and variations of the present invention are possible in light of the above teachings. It is therefore to be understood that within the scope of the appended claims, the invention may be practiced otherwise than as specifically described herein.

The invention claimed is:

1. A conduction inspection jig, comprising:

a support member;

a first member positioned on a substrate side of the support member and having a plurality of first openings and a flexural strength of 300 MPa or higher such that a substrate is configured to be connected to a tester;

a second member having a plurality of second openings and positioned on a printed wiring board side of the support member such that an electrical inspection is performed on a printed wiring board and that the support member is forming a space between the first member and the second member;

a plurality of third members positioned on a surface of the first member and between the first member and the substrate and configured to be laminated directly with respect to each other such that each of the third members has a plurality of third openings; and a probe configured to be positioned in one of the first openings in the first member and one of the second openings in the second member such that the probe penetrates through the one of the first openings, the space formed between the first member and the second member, and the one of the second openings and has a first end portion protruding from the first member and a second end portion protruding from the second member on an opposite side with respect to the first end portion, wherein the plurality of third openings in each of the third members is configured such that the probe penetrates through the one of the first openings in the first member and a respective one of the third openings in each of the third members.

2. The conduction inspection jig according to claim 1, wherein each of the third members has a flexural strength of lower than 300 MPa.

3. The conduction inspection jig according to claim 2, wherein each of the third members comprises resin.

4. The conduction inspection jig according to claim 2, wherein the first member comprises ceramic.

5. The conduction inspection jig according to claim 2, wherein each of the third members has a peripheral part and a central part formed such that the central part is formed thinner than the peripheral part.

6. The conduction inspection jig according to claim 2, wherein the second member has a flexural strength of 300 MPa or higher.

7. The conduction inspection jig according to claim 6, further comprising:

at least one fourth member positioned above the second member and having a plurality of fourth openings and a flexural strength of lower than 300 MPa, wherein the plurality of fourth openings is configured such that the probe penetrates through a respective one of the fourth openings.

8. The conduction inspection jig according to claim 6, wherein the second member comprises ceramic.

9. The conduction inspection jig according to claim 1, wherein the first member comprises ceramic.

10. The conduction inspection jig according to claim 1, wherein each of the third members has a peripheral part and a central part formed such that the central part is formed thinner than the peripheral part.

11. The conduction inspection jig according to claim 1, wherein the second member has a flexural strength of 300 MPa or higher.

12. The conduction inspection jig according to claim 11, further comprising:

at least one fourth member positioned above the second member and having a plurality of fourth openings and a flexural strength of lower than 300 MPa, wherein the plurality of fourth openings is configured such that the probe penetrates through a respective one of the fourth openings.

13. The conduction inspection jig according to claim 12, wherein the at least one fourth member comprises a plurality of fourth members.

14. The conduction inspection jig according to claim 12, wherein the at least one fourth member comprises resin.

15. The conduction inspection jig according to claim 11, wherein the second member comprises ceramic.

16. The conduction inspection jig according to claim 1, further comprising:

at least one fourth member positioned above the second member and has a plurality of fourth openings and a flexural strength lower than 300 MPa, wherein the plurality of fourth openings is configured such that the probe penetrates through a respective one of the fourth openings.

17. The conduction inspection jig according to claim 16, wherein the second member comprises resin, and the at least one fourth member comprises resin.

18. The conduction inspection jig according to claim 1, wherein the support member is configured to substantially surround the space formed between the first member and the second member.

19. The conduction inspection jig according to claim 1, wherein each of the third members has a peripheral part and a central part formed such that the central part is formed thinner than the peripheral part and that the plurality of openings is formed in the central part.

20. A method for manufacturing a printed wiring board, comprising:

setting the printed wiring board with respect to the conduction inspection jig of claim 1 such that the first end portion of the probe makes contact with an electrode of the printed wiring board and that the second end portion of the probe makes contact with an electrode connected to the tester; and conducting inspection of the printed wiring board using the tester.

* * * * *